United States Patent [19]

Miyao et al.

[11] Patent Number: 4,570,175

[45] Date of Patent: Feb. 11, 1986

[54] THREE-DIMENSIONAL SEMICONDUCTOR DEVICE WITH THIN FILM MONOCRYSTALLINE MEMBER CONTACTING SUBSTRATE AT A PLURALITY OF LOCATIONS

[75] Inventors: Masanobu Miyao, Tokorozawa; Makoto Ohkura, Hachioji; Iwao Takemoto; Terunori Warabisako, both of Nishitama; Kiichiro Mukai, Hachioji; Ryo Haruta, Kokubunji; Yasushiro Nishioka, Hachioji; Shinichiro Kimura, Kokubunji; Takashi Tokuyama, Higashikurume, all of Japan

[73] Assignee: Hitachi, Ltd., Tokyo, Japan

[21] Appl. No.: 505,377

[22] Filed: Jun. 16, 1983

[30] Foreign Application Priority Data

Jun. 22, 1982 [JP] Japan ................................ 57-106225

[51] Int. Cl.[4] ......................................... H01L 29/78
[52] U.S. Cl. ..................... 357/23.7; 357/23.9; 357/23.14; 357/54; 357/41; 357/42
[58] Field of Search ................... 357/23 TF, 23 R, 41, 357/42, 49, 4, 54

[56] References Cited

U.S. PATENT DOCUMENTS

| | | | |
|---|---|---|---|
| 3,946,418 | 3/1976 | Sigsbee et al. | 357/53 |
| 4,139,786 | 2/1979 | Raymond, Jr. et al. | 357/23 TF |
| 4,240,097 | 12/1980 | Raymond, Jr. | 357/23 TF |
| 4,272,880 | 6/1981 | Pashley | 357/42 |
| 4,377,819 | 3/1983 | Sakai et al. | 357/23 TF |
| 4,398,267 | 8/1983 | Furuyama | 357/23 TF |
| 4,479,297 | 10/1984 | Mizutani et al. | 357/49 |

FOREIGN PATENT DOCUMENTS

| | | | |
|---|---|---|---|
| 45046 | 2/1982 | European Pat. Off. | 357/23 TF |
| 2503864 | 8/1976 | Fed. Rep. of Germany | 357/23 TF |
| 83075 | 6/1981 | Japan | 357/23 FT |
| 150864 | 10/1981 | Japan | 357/23 TF |
| 125868 | 10/1981 | Japan | 357/23 TF |

OTHER PUBLICATIONS

Garnache, R. R., "Complimentary FET Memory Cell", IBM Technical Disclosure Bulletin, vol. 18, No. 12, May 1976.

Colinge et al., "ST-CMOS: A Double-Poly-N-MOS-Compatible CMOS Technology", Conference International Electron Device Meeting, Washington, DC (Dec. 1981).

Primary Examiner—Joseph E. Clawson, Jr.
Assistant Examiner—Robert P. Limanek
Attorney, Agent, or Firm—Antonelli, Terry & Wands

[57] ABSTRACT

At least one layer of insulator film and single-crystal film are alternately stacked and deposited on a surface of a semiconductor substrate, and an impurity-doped region formed in each semiconductor film is used as a gate, source or drain of a MOS transistor.

Thus, a three-dimensional semiconductor device is constructed in which MOS transistors are arranged, not only in the direction of the semiconductor substrate surface, but also in a direction perpendicular thereto.

3 Claims, 7 Drawing Figures

THREE-DIMENSIONAL SEMICONDUCTOR DEVICE WITH THIN FILM MONOCRYSTALLINE MEMBER CONTACTING SUBSTRATE AT A PLURALITY OF LOCATIONS

BACKGROUND OF THE INVENTION

1. Field of the Invention

The present invention relates to a semiconductor device having a three-dimensional structure, and more particularly to a three-dimensional semiconductor device which is well-suited for attaining a high density of integration.

2. Description of the Prior Art

As is well known, most conventional semiconductor devices have been such that elements such as transistors are formed in the surface region of a semiconductor substrate. Even an LSI having a high density of integration has been similarly formed in the surface region of a semiconductor substrate.

Since, however, the number of elements such as transistors to be formed in the surface region of a single semiconductor substrate has strikingly increased in recent years, it has gradually become difficult to rapidly increase the number of the elements still more in the future so as to enhance the density of integration of a semiconductor integrated circuit over great strides.

In order to solve this problem, there has been proposed the so-called three-demensional semiconductor device wherein insulator films and single-crystal semiconductor films are alternately stacked on a semiconductor substrate and wherein a large number of elements are formed in each of the semiconductor films.

For example, there has been proposed a three-dimensional semiconductor device of a structure wherein p-channel MOS transistors are formed on a substrate side, stacked Si and insulator films are formed thereon by the use of the well-known SOI (Silicon On Insulator) technique, and n-channel MOS transistors are formed by utilizing the interfaces of the Si and SiO$_2$ films. That is, this semiconductor device employs a single gate as the common gates of the upper and lower MOS transistors, thereby making it possible to simultaneously operate the p-channel and n-channel MOS transistors by the single gate used in common. (Gibbons et al., IEEE, EDL-1, 117, 1980)

Since, however, the semiconductor devices of three-dimensional structures are not long-established, a novel structure must be found out in order to fabricate a semiconductor device which has a still higher density of integration and which affords new functions.

SUMMARY OF THE INVENTION

An object of the present invention is to solve the problem of the prior art, and to provide a three-dimensional semiconductor device which has a very high density of integration and which affords new functions.

In order to accomplish the object, according to the present invention, at least one insulator film and single-crystal semiconductor films are stacked on a semiconductor substrate, and at least one p$^+$ or n$^+$ region formed within each of the semiconductor films is used as a source, drain or gate, whereby a plurality of MOS transistors are formed, not only in the planar direction of the semiconductor substrate, but also in the vertical direction thereof.

DETAILED DESCRIPTION OF THE PREFERRED EMBODIMENTS

Figure 1:
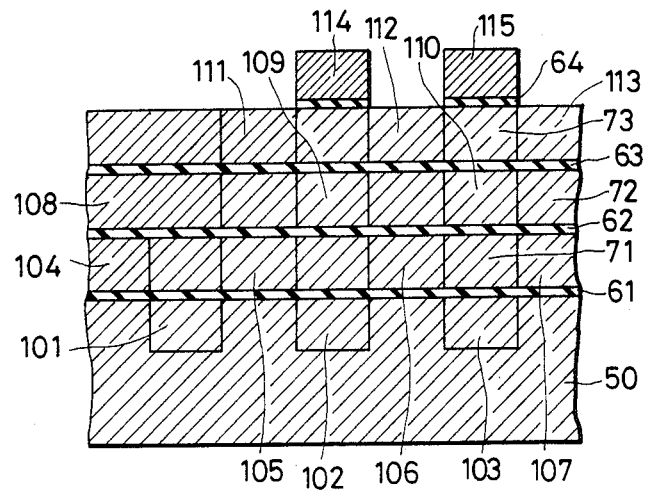
FIG. 1 is a model diagram for explaining the construction of the present invention.

FIG. 1 is a model diagram for explaining the concept of the present invention.

In the figure, numeral 50 designates a single-crystal semiconductor substrate, numerals 61 to 64 designate insulator films, numerals 71 to 73 designate single-crystal semiconductor films, and numerals 101 to 115 designate p$^+$ or n$^+$ doped regions formed by well-known processes such as ion implantation and thermal diffusion. Herein, the regions 114 and 115 located in the uppermost layer may be formed of a conductor such a metal or of heavily-doped polycrystalline silicon, not by doping a single-crystal semiconductor with an impurity.

Thus, a plurality of MOS transistors are formed in the planar direction and vertical direction of the semiconductor substrate.

More specifically, when the doped region 111 is used as a gate, the doped regions 108 and 109 formed in the underlying semiconductor layer 72 serve as drain and source regions, respectively, so that one MOS transistor is constructed.

Likewise, when the doped region 112 is used as a gate, the doped regions 109 and 110 serve as drain and source regions to constitute a MOS transistor, respectively.

The doped regions 108, 109 and 110 referred to above, however, can also be used as gates, not as the source or drain regions. In this case, the semiconductor layers 104, 105, 106 and 107 underlying those doped regions serve as drain or source regions, respectively.

In addition, when the uppermost doped regions (which may well be the conductive films) 114 and 115 are used as gates, the doped regions 111 and 112 exemplified as the gates in the above and the doped region 113 serve as drain or source regions.

That is, among the plurality of doped regions, the uppermost ones 114, 115 are used as only the gates and the lowermost ones 102, 103 as only the source or drain regions, whereas the intermediate ones 104, 105, . . . and 113 can be used as both the gates and the source or drain regions.

Besides, the intermediate doped regions 104, 105, . . . and 113 can function as the gates, not only for the underlying doped regions, but also for the overlying doped regions.

For example, the doped region 105 can be used as the gate of a MOS transistor whose drain and source regions are the underlying doped regions 101 and 102, respectively, and it can also be used as the gate of a MOS transistor whose drain and source regions are the overlying doped regions 108 and 109, respectively. That is, the doped region 105 can be used as the common gates of both the transistors.

Accordingly, when the regions 108, 109 are p$^+$ regions and the regions 101, 102 are n$^+$ regions by way of example, the p-channel MOS transistor and the n-channel MOS transistor can be simultaneously operated owing to the common gate region 105.

For example, the doped regions 109 and 110 can serve also as a drain and a source which are common to the two doped regions 112 and 106 located above and below. Thus, two MOS transistors which are operated by either of the gates 112 and 106 are constructed.

As thus far described, at least one layer of insulator film and single-crystal semiconductor film are alternately stacked and formed on a semiconductor substrate, and at least one p+ or n+ doped region is formed within the semiconductor substrate or within each semiconductor film, to make up one or more MOS transistors out of a gate electrode or electrodes provided in the uppermost layer and the doped regions within the semiconductor film of the underlying layer and also to make up other MOS transistors out of these doped regions and the doped regions within the semiconductor film of the still underlying layer. Regarding two MOS transistors respectively formed on the upper layer side and the lower layer side, the source (drain) of one transistor can serve also as the gate electrode of the other transistor, while the same can simultaneously serve as the source (drain) of the other transistor.

EMBODIMENT 1

Figure 2A:
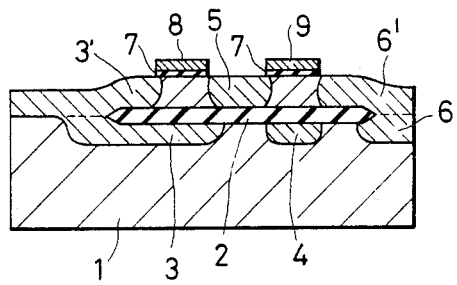
FIGS. 2a and 2b, FIGS. 3a and 3b, and FIGS. 4a and 4b are sectional views and circuit diagrams, respectively showing different embodiments of the present invention.
Figure 2B:
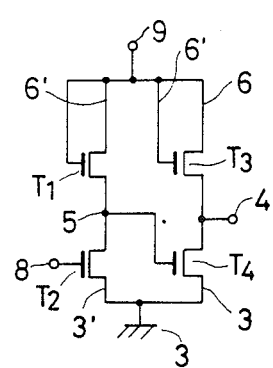

FIG. 2a shows a sectional structure of an embodiment of the present invention, while FIG. 2b is a circuit diagram thereof. In these figures, the same reference numerals denote the same parts.

This embodiment is an example wherein a two-stage inverter circuit is formed using one impurity-doped region as the source of one of two MOS transistors and simultaneously as the gate of the other MOS transistor. First, n+ impurity-doped regions 3, 4 and 6 are formed in a semiconductor substrate 1, whereupon an insulator film 2 is formed. Subsequently, amorphous or polycrystalline Si is deposited on the whole surface, and the deposited amorphous or polycrystalline Si layer is turned into a single crystal or nearly a single crystal by a well-known method such as laser beam irradiation, electron beam irradiation, or local heating with a rectilinear heater. Thereafter, a gate oxide film 7 and gate electrodes 8 and 9 are formed, whereupon using the gate electrodes 8 and 9 as a mask, an n+ impurity is introduced into selected regions to form n+ regions 3', 5 and 6'.

The semiconductor device manufactured by the above steps forms the two-stage inverter circuit in which four MOS transistors $T_1$–$T_4$ are connected as shown in FIG. 2b.

More specifically, the first transistor $T_1$ is composed of the gate electrode 9 and the source and drain 5 and 6', the second transistor $T_2$ is composed of the gate 8 and the source and drain 3' and 5, the third transistor $T_3$ is composed of the gate 6' and the source and drain 4 and 6, and the fourth transistor $T_4$ is composed of the gate 5 and the source and drain 3 and 4. Here, the n+ region 5 serves as the source of the first transistor $T_1$ and simultaneously as the gate of the fourth transistor $T_4$, while the n+ region 6' serves as the drain of the first transistor $T_1$ and simultaneously as the gate of the third transistor $T_3$. Further, in this case, the impurity-doped layers completely isolated by the insulator film 2 and the layers partly connected coexist, which forms one feature of this embodiment. More specifically, in the transistor $T_4$, the gate 5 and the source 4 are completely isolated by the insulator film. As to the transistors $T_4$ and $T_2$, however, these two transistors are connected by the n+ regions 3 and 3'. In other words, the upper and lower transistors $T_2$ and $T_4$ are connected by the n+ regions 3 and 3', which is advantageous for constructing a three-dimensional device.

In this manner, according to the present embodiment, a plurality of MOS transistors can be formed in the vertical direction comparatively simply, and it has become possible to form the four MOS transistors within an area which is occupied by the two MOS transistors formed by the prior art.

EMBODIMENT 2

Figure 3A:
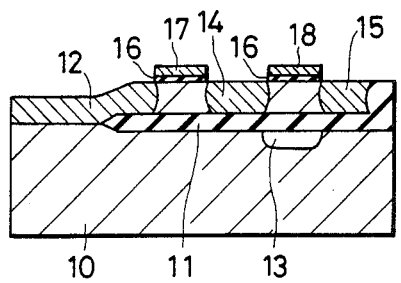
Figure 3B:
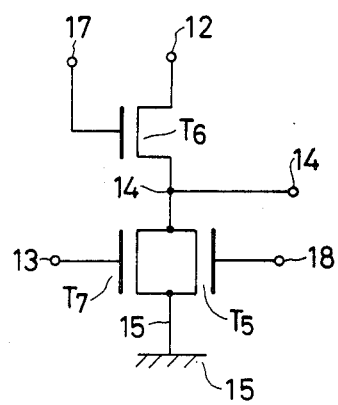

FIG. 3a shows a sectional structure of another embodiment of the present invention, while FIG. 3b is a circuit diagram thereof.

This embodiment is such that an OR circuit is constructed using a single impurity-doped region as the common sources (drains) of two MOS transistors. The manufacturing process of this embodiment is substantially the same as in the case of Embodiment 1, and three MOS transistors $T_5$–$T_7$ are constructed of a semiconductor substrate 10, impurity-doped regions 12, 13, 14 and 15, insulator films 11 and 16, and gate electrodes 17 and 18. The first transistor $T_5$ is composed of the gate 18 and the source and drain 14 and 15, the second transistor $T_6$ is composed of the gate 17 and the source and drain 12 and 14, and the third transistor $T_7$ is composed of the gate 13 and the source and drain 14 and 15. Here, the doped regions 14 and 15 are the source and drain of the first transistor $T_5$ and simultaneously the source and drain of the third transistor $T_7$. Now, in case of employing the doped region 13 and the gate 18 of the first MOS transistor $T_5$ as input terminals, when an input voltage enters either of them, an output is generated at the output terminal (doped region) 14. Therefore, the present embodiment becomes a semiconductor device which constructs a NOR circuit. In this manner, according to the present embodiment, the logic circuit composed of the three transistors is formed within the area which is occupied by the two transistors formed by the prior art.

EMBODIMENT 3

Figure 4A:
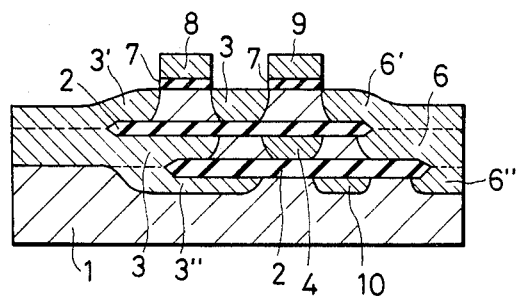
Figure 4B:
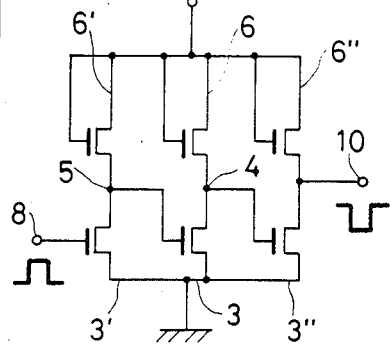

FIGS. 4a and 4b are a sectional view and a circuit diagram showing another embodiment of the present invention, respectively.

This embodiment is extended to a structure which has a larger number of layers than in Embodiments 1 and 2. It extends the inverter circuit of two stages shown in FIG. 1, to form an inverter circuit of three stages. According to the present embodiment, six MOS transistors can be formed within the area which is occupied by the two MOS transistors formed by the prior art.

While, in the foregoing embodiments, all the impurity-doped layers have been the n+ layers, naturally quite similar circuits are formed even when the impurity-doped layers are p+ layers.

As set forth above, according to the present invention, it becomes possible to form MOS transistors in a larger number than in the case of the prior art, within an identical area of a semiconductor device, and a higher density of integration can be realized.

What is claimed is:
1. A semiconductor device comprising:
a substrate of a first conductivity type;
a first insulating layer formed over a predetermined portion of said substrate;
a first single crystal semiconductor film formed to cover said first insulating film to cover portions of said substrate which are uncovered by said first insulating film and which are adjacent to an area of said substrate covered by said first insulating film;

first, second and third impurity doped regions formed within said substrate, said first, second and third impurity doped regions being of a second conductivity type opposite to that of said substrate and being separated from one another in said substrate, said second impurity region being completely covered by said first insulating film and said first and third regions being partially covered by said first insulating film and partially covered by said first single crystal semiconductor film;

fourth, fifth and sixty impurity doped regions formed within said first single crystal semiconductor film, said fourth, fifth and sixth regions having said second conductivity type and being spaced apart from one another in said first semiconductor film, wherein said fourth region is formed to have a first portion which overlaps a portion of said first insulating film and to have a second portion which lies in contact with said first region in said substrate, wherein said fifth region is formed to overlay said first insulating film to extend over a portion of said substrate located between said first and second semiconductor regions, and wherein said sixth region is formed to have a first portion which overlaps a portion of said first insulating film and to have a second portion which lies in contact with said third region of said substrate;

a second insulating film formed over said first semiconductor film to cover a portion of said first semiconductor film between said foruth and fifth semiconductor regions;

a third insulating film formed over said first semiconductor film to cover a portion of said first semiconductor film between said fifth and sixth semiconductor regions;

a first conductor formed over said second insulating film; and a second conductor formed over said third insulating film.

2. A semiconductor device formed to include at least four field effect transistors coupled to operate as a two-stage inverter, said semiconductor device comprising:

a substrate of a first conductivity type;

a first insulating layer formed over a predetermined portion of said substrate;

a first single crystal semiconductor film formed to cover said first insulating film to cover portions of said substrate which are uncovered by said first insulating film and which are adjacent to an area of said substrate covered by said first insulating film;

first, second and third impurity doped regions formed within said substrate, said first, second and third impurity doped regions being of a second conductivity type opposite to that of said substrate and being separated from one another in said substrate, said second impurity region being completely covered by said first insulating film and said first and third regions being partially covered by said first insulating film and partially covered by said first single crystal semiconductor film;

fourth, fifth and sixth impurity doped regions formed within said first single crystal semiconductor film, said fourth, fifth and sixth regions having said second conductivity type and being spaced apart from one another in said first semiconductor film, wherein said fourth region is formed to have a first portion which overlaps a portion of said first insulating film and to have a second portion which lies in contact with said first region in said substrate, wherein said fifth region is formed to overlay said first insulating film to extend over a portion of said substrate located between said first and second semiconductor regions, and wherein said sixth region is formed to have a first portion which overlaps a portion of said first insulating film and to have a second portion which lies in contact with said third region of said substrate;

a second insulating film formed over said first semiconductor film to cover a portion of said first semiconductor film between said fourth and fifth semiconductor regions;

a third insulating film formed over said first semiconductor film to cover a portion of said first semiconductor film between said fifth and sixth semiconductor regions;

a first conductor formed over said second insulating film; and a second conductor formed over said third insulating film, wherein a first transistor is formed by said second conductor as a gate electrode, said fifth region as a source and said sixth region as a drain, wherein a second transistor is formed by said first conductor as a gate electrode, said fourth region as a source and said fifth region as a drain, wherein a third transistor is formed by said sixth region as a gate, said second region as a source and said third region as a drain, wherein a fourth transistor is formed by said fifth region as a gate, said first region as a source and said second region as a drain, and wherein said first conductor operates as an input of said inverter, said second conductor operates as a first power source terminal of said inverter, said first and fourth regions are coupled together to operate as a second power source terminal of said inverter, and said second region operates as an output of said inverter.

3. A semiconductor device comprising:

a substrate of a first conductivity type;

a first insulating layer formed over a predetermined portion of said substrate;

a first single crystal semiconductor film formed to cover said first insulating film to cover portions of said substrate which are uncovered by said first insulating film and which are adjacent to an area of said substrate covered by said first insulating film;

first, second and third impurity doped regions formed within said substrate, said first, second and third impurity doped regions being of a second conductivity type opposite to that of said substrate and being separated from one another in said substrate, said second impurity region being completely covered by said first insulating film and said first and third regions being partially covered by said first insulating film and partially covered by said first single crystal semiconductor film;

fourth, fifth and sixth impurity doped regions formed within said first single crystal semiconductor film, said fourth, fifth and sixth regions having said second conductivity type and being spaced apart from one another in said first semiconductor film, wherein said fourth region is formed to have a first portion which overlaps a portion of said first insulating film and to have a second portion which lies in contact with said first region in said substrate, wherein said fifth region is formed to overlay said first insulating film to extend over a portion of said substrate located between said first and second semiconductor regions, and wherein said sixth region is formed to have a first portion which overlaps a portion of said first insulating film and to have a second portion which lies in contact with said third region of said substrate;

a second insulating film formed over a predetermined portion of said first semiconductor film;

a second single crystal semiconductor film formed to cover said second insulating film and to cover portions of said first semiconductor film which are uncovered by said insulating film, and which are adjacent to an area of said first semiconductor film covered by said second insulating film;

seventh, eighth and ninth impurity doped regions formed within said second seiconductor film, said seventh, eighth and ninth regions having said second conductity type and being spaced apart from one another in said second semiconductor film, wherein said seventh semiconductor region is formed to have a first portion which overlaps a portion of said second insulating film and to have a second portion which lies in contact with said fourth region in said first semiconductor film, wherein said eighth region is formed to overlay said second insulating film to extend over a portion of said first semiconductor film located between said fourth and fifth semiconductor regions, and wherein said ninth region is formed to have a first portion which overlaps a portion of said second insulating film and to have a second portion which lies in contact with said sixth region of said first semiconductor film;

a third insulating film formed over said second semiconductor film to cover a portion of said second semiconductor film between said seventh and eighth semiconductor regions;

a fourth insulating film formed over said second semiconductor film to cover a portion of said second semiconductor film between said eighth and ninth semiconductor regions;

a first conductor formed over said third insulating film; and a second conductor formed over said fourth insulating film.

* * * * *